(12) United States Patent
Van De Kerkhof et al.

(10) Patent No.: US 7,518,703 B2
(45) Date of Patent: Apr. 14, 2009

(54) LITHOGRAPHIC APPARATUS AND METHOD

(75) Inventors: Marcus Adrianus Van De Kerkhof, Helmond (NL); Ivo Adam Johannes Thomas, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 27 days.

(21) Appl. No.: 11/167,945

(22) Filed: Jun. 28, 2005

(65) Prior Publication Data

US 2006/0290910 A1 Dec. 28, 2006

(51) Int. Cl.
*G03B 27/32* (2006.01)
*G03B 27/42* (2006.01)

(52) U.S. Cl. .......................... 355/53; 355/77

(58) Field of Classification Search .................. 355/52, 355/53, 55, 72, 77, 67, 53.5
See application file for complete search history.

(56) References Cited

U.S. PATENT DOCUMENTS

| | | | |
|---|---|---|---|
| 5,734,478 A | 3/1998 | Magome et al. ............. 356/401 |
| 5,814,425 A | 9/1998 | Kataoka et al. ............... 430/30 |
| 5,898,501 A | 4/1999 | Suzuki et al. ................ 356/359 |
| 6,650,399 B2 | 11/2003 | Baselmans et al. ............ 355/55 |
| 6,833,906 B1 | 12/2004 | Ohsaki et al. ................. 355/69 |
| 6,859,264 B2 * | 2/2005 | Nakauchi et al. .............. 355/68 |
| 6,897,940 B2 | 5/2005 | Sogard ......................... 355/55 |
| 7,187,431 B2 | 3/2007 | Kok et al. |
| 7,224,431 B2 * | 5/2007 | Mulkens et al. ............... 355/53 |
| 7,375,799 B2 | 5/2008 | Van de Kerkhof et al. |
| 2001/0001088 A1 | 5/2001 | Chesley et al. ............. 451/538 |
| 2003/0164934 A1 * | 9/2003 | Nishi et al. ................... 355/72 |
| 2005/0007602 A1 | 1/2005 | Haidner et al. ............. 356/521 |

FOREIGN PATENT DOCUMENTS

EP 1 231 517 A1 8/2002

* cited by examiner

*Primary Examiner*—Rodney E Fuller
(74) *Attorney, Agent, or Firm*—Sterne, Kessler, Goldstein & Fox P.L.L.C.

(57) ABSTRACT

A lithographic apparatus is arranged to project a patterned radiation beam from a patterning device onto a substrate using a projection system. The lithographic apparatus comprises: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a measurement system for measuring the wavefront aberration or other property of the apparatus. The measurement system comprises: a source module at the level of the substrate table for providing an effective source of radiation; and a sensor unit at the level of the support, for receiving radiation from the source module through the projection system for performing the measurement.

18 Claims, 2 Drawing Sheets

Fig. 2
Fig. 3
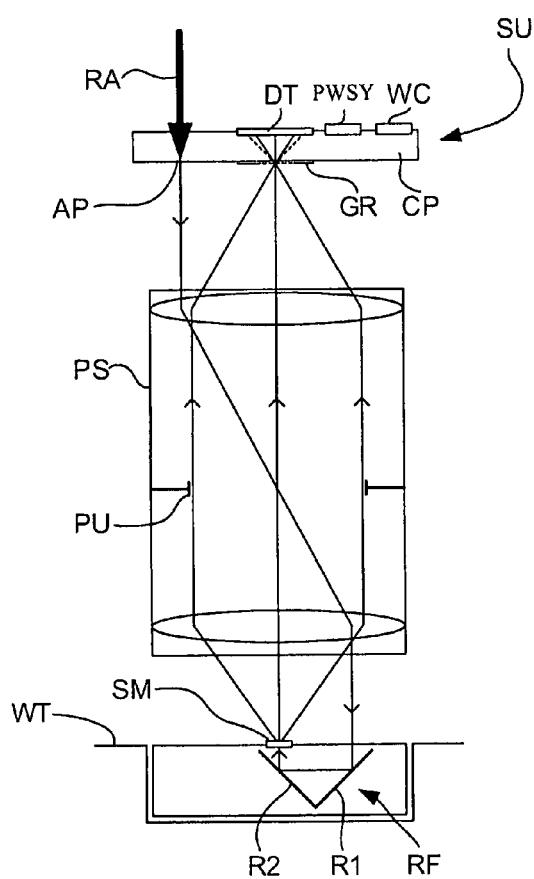
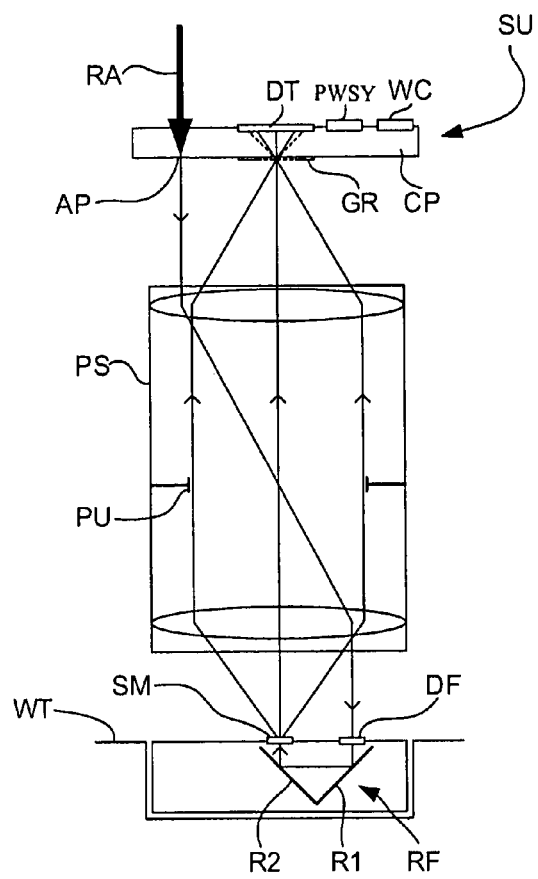

LITHOGRAPHIC APPARATUS AND METHOD

1. FIELD

The present invention relates to an apparatus and method for determining properties, such as the aberration, numerical aperture and telecentricity, of the projection lens in a lithographic apparatus

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is a desire to integrate an ever-increasing number of electronic components in an IC. To realize this it is necessary to decrease the size of the components and therefore to increase the resolution of the projection system, so that increasingly smaller details, or line widths, can be projected on a target portion of the substrate. For the projection system this means that the projection system and the lens elements used in the projection system must comply with very stringent quality requirements. Despite the great care taken during the manufacturing of lens elements and the projection system they both may still suffer from wave front aberrations, such as, for example, displacement, defocus, astigmatism, coma and spherical aberration across an image field projected with the projection system onto a target portion of the substrate. Said aberrations are important sources of variations of the imaged line widths occurring across the image field. It is important that the imaged line widths at different points within the image field are constant. If the line width variation is large, the substrate on which the image field is projected may be rejected during a quality inspection of the substrate. Using techniques such as phase-shifting masks, or off-axis illumination, the influence of wave front aberrations on the imaged line widths may further increase.

After the projection system has been built into a lithographic projection apparatus, the wave front aberrations may need to be measured. Moreover, since wave front aberrations may vary in time in a projection system, for instance, due to deterioration of the lens material or lens heating effects (local heating of the lens material), it may be necessary to measure the aberrations at certain instants in time during operation of the apparatus and to adjust certain movable lens elements accordingly to minimize wave front aberrations. The short time scale, on which lens-heating effects may occur, may require measuring the wave front aberrations frequently. The measured wave front aberrations may be expressed, for example, in terms of Zernike coefficients.

In a lithographic apparatus it can be important to know other characteristics of the projection system used for imaging the pattern on the patterning device onto the substrate, as well as or instead of the wave front aberrations. Such characteristics may also be referred to as properties or parameters of the projection system. One such property is the numerical aperture (NA) of the lens system, which affects the imaging of the lithographic apparatus. Knowledge of the exact value of the numerical aperture can be used in simulations to determine settings and process windows for the lithographic apparatus. In some apparatus, the projection system has an adjustable numerical aperture that is defined by means such as an adjustable diaphragm at a pupil plane in the projection lens system. Measurement of the actual numerical aperture setting is thus important.

Another characteristic that it can be desirable to evaluate is the telecentricity of the projection lens system. Non-telecentricity of the projection system affects the imaging performance and can cause overlay problems.

The demand for ever-smaller features to be imaged with lithographic apparatus has further resulted in the use of projection systems with increasing numerical aperture (NA). The angle of rays of radiation within the projection apparatus with respect to the optical axis increases with increasing NA. The vector nature of light becomes important for imaging because only identically polarized components of electromagnetic waves interfere. Therefore it is not the wave front quality alone that determines the image contrast; the polarization has a considerable influence as well. Furthermore, the use of illumination radiation having specifically desired states of polarization for specific regions is increasingly being used for imaging features aligned in particular directions. Consequently, it is desirable to know the state of polarization of the radiation impinging on the patterning device, such as a reticle, and it is desirable to know, as another property of the projection system, the effect on the state of polarization caused by the projection system, for example expressed as Jones matrices.

Various apparatus has been described for measuring the above properties. Typically, such apparatus consists of a source module positionable in the beam path at the level of the reticle for conditioning the radiation, for example by providing a desired spatial intensity distribution, angular intensity distribution and/or polarization. The radiation then traverses the projection system and is then incident on a sensor unit at the wafer level or in the wafer table of the lithographic apparatus. The sensor unit contains a detector, either a single detector or an array of multiple detectors, for radiation intensity measurements. The source module and sensor unit usually comprise further optical elements, such as pinholes, gratings, lenses, birefringent waveplates, and so forth, as necessary for measuring the desired property of the projection system.

However, there is a problem because of lack of space in the lithographic apparatus, particularly at wafer level, for installing the sensor unit. This problem is even more acute when trying to retro-fit a sensor unit in an older apparatus that is only capable of handling eight inch (200 mm) wafers or smaller.

A further problem is that of heat dissipation by the sensor unit in the wafer table. The detector electronics inevitably generate heat, and heat dissipation is very critical with respect to overlay and focus performance of the apparatus.

A yet further problem is the constraint on connectivity with the sensor unit at wafer level; i.e. the problem of physically routing wires to the sensor unit and connecting them to other electronics in the apparatus, for example for supplying power and control signals to the source module, and for communication of the detection results to a computer and/or storage device for obtaining the measurement of the desired properties.

3. SUMMARY

It is desirable to have information regarding one or more properties of the projection lens system, and it is desirable to be able to incorporate a system for measuring these properties in a lithographic projection apparatus, even when space is limited or other constraints are present.

According to one aspect of the present invention there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a measurement system for measuring at least one property of the apparatus, wherein the measurement system comprises:

a source module at the level of the substrate table for providing an effective source of radiation; and a sensor unit at the level of the support, for receiving radiation from the source module through the projection system for performing the measurement.

According to another aspect of the present invention there is provided a method for measuring properties of a lithographic apparatus, the lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the method comprises:

transmitting radiation from a source module at the level of the substrate table, through the projection system, to a sensor unit at the level of the support.

4. BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 shows a schematic cross-section of the projection lens system as well as the optical components at mask level and wafer level according to a first embodiment of the invention; and FIG. 3 shows a schematic cross-section of the projection lens system as well as the optical components at the reticle level and wafer level according to a second embodiment of the invention.

5. DETAILED DESCRIPTION

Figure 1:
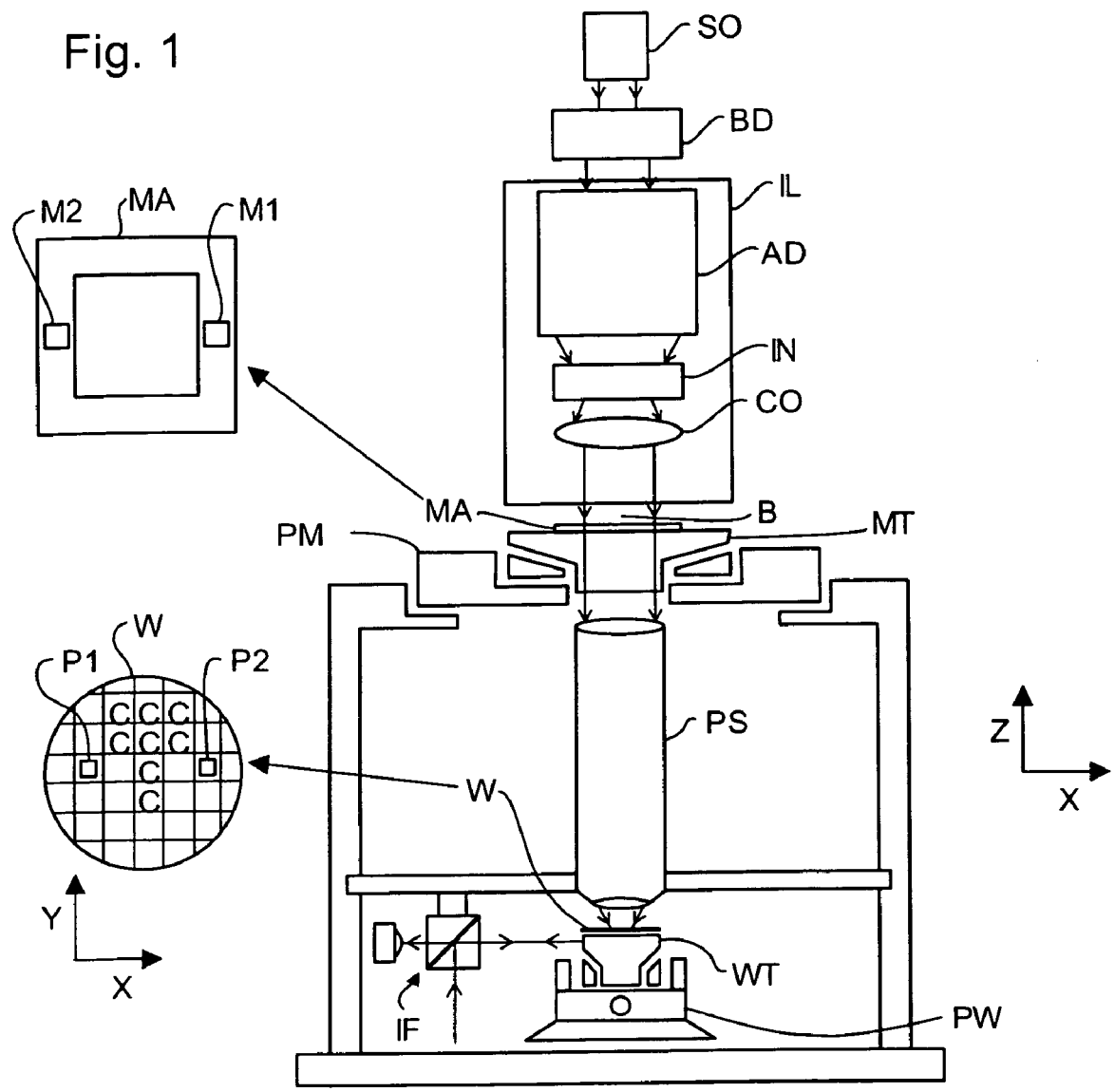
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Previously, measurement systems have been proposed for measuring properties of the projection system PS in which a source module is located at the level of the patterning device and a sensor unit is located at the level of the substrate. The sensor unit receives radiation after it has passed through the projection system in the normal way in which an exposure is performed. However, the devisors of the present invention have realized that the properties of the projection system can equally well be measured by passing radiation in the opposite direction through the projection system PS. The effect of the projection system on the radiation can be reconstructed equally well by passing radiation through in either direction because the ray path of any particular portion of the radiation is essentially reversible.

This realization by the devisors of the invention means that the sensor unit can be located at the level of the patterning device (reticle) which can avoid some of the problems with the prior apparatus. Instead of having an actual radiation source at the substrate table, an effective source module is used which comprises a reflector for receiving radiation from the illumination system via the projection system and reflecting it back through the projection system PS to the sensor unit.

An embodiment of the invention will now be described particularly directed to a system for measuring wave front aberrations, but this is purely one example of a measurement system to which the invention may be applied. Examples of other properties which may be measured by systems according to the invention include numerical aperture, telecentricity, polarization change and lens transmission profile.

As shown in FIG. 2, radiation from the illumination system of the lithographic projection apparatus is indicated by arrow RA. The radiation is constrained by a large aperture AP defined, for example, in an opaque chromium layer on the carrier plate CP. The large aperture AP means that the radiation does not diffract significantly. The radiation then travels through the projection system PS with very little aberration and then enters the reflector RF. The reflector RF in this example comprises two reflective elements R1, R2, such as mirrors or reflective surfaces. By using one or more reflective elements, the reflector reflects the radiation back towards the projection system PS, but with a horizontal displacement to spatially separate the beams entering and exiting the reflector RF, such that the radiation exiting the reflector will be imaged at a different point at the reticle level. The reflector RF can be a retro-reflector, but this is not essential, and other suitable reflector arrangements and/or light guide arrangements e.g. optical fibers, rods etc can be used, such that the radiation is steered to a source module, discussed below, and returned back towards the projection system; these arrangements may be referred to as a radiation steering device.

The radiation reflected by the reflector enters the effective source module SM which will be discussed further below. The reflector RF and source module SM are, in this embodiment, built into the substrate table WT.

One measurement system for measuring wave front aberrations of a projection lens uses the principal known as a "shearing interferometer". According to this system, different portions of the beam of radiation emanating from the source module (referred to hereinafter as the projection beam) travel along different paths through the projection lens. This can be achieved by a diffractive element located in the projection beam. The diffractive element, such as a grating, also known as the object grating, diffracts the radiation and spreads it out such that it passes through the projection system along a plurality of different paths, and such that the mutual coherence of the radiation of the projection beam in the plane of the pupil PU of the projection system PS has along at least one direction a local maximum at a preselected distance between two points in the pupil plane. The diffractive element can be a grating or can be an array of features of suitable size, and may be provided within a pinhole. One or more lenses may also be associated with the diffractive element. This assembly as a whole is referred to as the source module.

One example of a source module SM comprises a pinhole plate which is a quartz glass plate with an opaque chromium layer on one side, same as a reticle, and with a pinhole provided in the chromium layer. It also comprises a lens for focusing the projection radiation on to the pinhole. In practice an array of pinholes and lenses for different field positions and different slit positions are provided, and the lenses can be integrated with the pinhole plate. The source module should ideally generate light within a wide range of angles such that the pupil of the projection lens is filled, or indeed overfilled, and preferably the pupil filling should be uniform. The use of the lens can achieve the over-filling and also increases the light intensity. The pinhole limits the light to a specific location within the field. Alternative ways to obtain uniform pupil filling are to use a diffusor (such as an etched ground glass plate) prior to the radiation impinging on the pinhole plate, or an array of microlenses (similar to a diffractive optical element DOE), or a holographic diffusor (similar to a phase-shift mask PSM). The pinhole may have some structuring within, such as sub-resolution diffractive features e.g. grating patterns, checkerboard patterns, but this is optional. In general, depending on what property is being measured, the source module (and corresponding sensor unit described below) comprise combinations of one or more of the following: pinhole, lens, grating, waveplate, diffusor, diffractive optical element, and holographic element.

After exiting the source module, radiation traverses the projection system then impinges on a diffractive element GR, such as a pinhole or a grating, known as the image grating. Referring to FIG. 2, the further diffractive element GR is mounted on a carrier plate CP, for example made of quartz. This further diffractive element acts as the "shearing mechanism" that generates different diffractive orders which can be made to interfere with each other. For example, the zero order may be made to interfere with the first order. This interference results in a pattern, which can be detected by a detector to reveal information on the wave front aberration at a particular location in the image field. The detector DT can be, for example, a CCD or CMOS camera which captures the image of the pattern electronically without using a resist. The diffractive element GR and the detector DT can be referred to as an interferometric sensor. In this embodiment, the diffractive element GR is located at the level of the reticle, such that it is at a conjugate plane with respect to the first-mentioned diffractive element or diffusor in the source module SM. The detector DT is spaced apart from the diffractive element GR.

The interferometric sensor essentially measures the spatial derivative of the wave front. The detector itself can only measure light intensity, but by using interference a phase difference pattern can be converted to a corresponding intensity pattern. Most interferometers require a secondary reference beam to create an interference pattern, but this would be hard to implement in a lithographic projection apparatus. However a class of interferometer which does not have this requirement is the shearing interferometer. In the case of lateral shearing, interference occurs between the wavefront and a laterally displaced (sheared) copy of the original wavefront, whereby said lateral displacement is arranged in accordance with said preselected distance at which the mutual coherence in the pupil PU has a local maximum. In the present embodiment, the further diffractive element GR splits the wavefront into multiple wavefronts which are slightly displaced (sheared) with respect to each other. Interference is observed between waves of preselected diffraction order, whereas interference between other diffracted orders is reduced in accordance with a relative decrease of mutual coherence at distances other than said predetermined distance. In the present case only the zero and +/−first diffraction orders are considered. The intensity of the interference pattern relates to the phase difference between the zero and first diffraction orders. It can be shown that the intensity I is given by the following approximate relation:

$$I \approx 4E_0 E_1 \cos\left(2\pi\left[\frac{k}{p} + \frac{1}{2}\left(W\left(\rho + \frac{1}{p}\right) - W\left(\rho - \frac{1}{p}\right)\right)\right]\right)$$

where $E_0$ and $E_1$ are the diffraction efficiencies for the zero and first diffracted orders, k is the phase stepping distance, p is the grating periodicity (in units of waves), W is the wavefront aberration (in units of waves) and $\rho$ is the pupil location. In the case of small shearing distances, the wavefront phase difference approximates the spatial derivative of the wavefront. By performing successive intensity measurements, with a slight displacement of the source module SM with respect to the sensor unit SU, the detected radiation intensity is modulated (the phase stepping factor k/p in the above equation is varied). Either the substrate table WT or the sensor unit SU can be moved to vary the phase-stepping; in practice, moving the substrate table WT is most convenient. The first harmonics (with the period of the grating as the fundamental frequency) of the modulated signal correspond to the diffraction orders of interest (0 & +/−1). The phase distribution (as a function of pupil location) corresponds to the wavefront difference of interest. By shearing in two substantially perpendicular directions, the wavefront difference in two directions is considered.

From these intensity measurements, the wave front derivative can be obtained, which can yield the aberrated wave front itself, which can be expressed, for example, as Zernike coefficients.

A further embodiment of the invention is illustrated in FIG. 3. According to this embodiment a diffusor DF is located at the entrance to the reflector RF. This has the additional advantage of improving scrambling of the phase profile of the entrance beam. Any backwards scattering by the diffusor will be imaged by the projection system PS at the entrance point AP at reticle level and not at the entrance point of the sensor unit SU.

Further information regarding interferometric wave front measurement techniques, such as described in the above embodiments of the invention, can be obtained, for example from EP 1,231,517 and US 2005/0007602. However, the invention is not limited to wave front aberration measurements, and can be used for measuring other properties of the lithographic apparatus. Examples of other measurements with which the invention can be used are given in the following references. Information regarding use of a similar measurement system for obtaining information on numerical aperture and telecentricity can be obtained from co-pending application U.S. Ser. No. 10/988,845. Additional information regarding measurements of the effect of the projection system on the state of polarization of radiation can be obtained from co-pending application U.S. Ser. No. 11/065,349.

According to the embodiment of the invention illustrated in FIG. 2, the sensor unit SU can be loaded and unloaded exactly like a regular patterning device, such as a reticle, using the existing reticle handling equipment in the apparatus. This means that loading and unloading can be performed rapidly and automatically, such that measurements can be made, if desired, before, during and/or after exposures or batches of exposures of a reticle pattern on a resist-coated wafer, such that system performance can be regularly and conveniently monitored and optimized if necessary.

Flexible wires could be used to electrically connect the sensor unit to the rest of the apparatus. However, according to the present preferred embodiment, the sensor unit interfaces with the lithographic apparatus wirelessly. The sensor unit comprises a wireless communication unit WC and communication to and from the sensor unit is done via an infrared or radio frequency link. The sensor unit has a power supply PWSY that comprises either batteries or a photovoltaic cell which is illuminated by an appropriate source of electro magnetic radiation to generate electrical power.

The sensor unit SU in this preferred embodiment further comprises its own CPU and memory for the purpose of data acquisition, analysis and storage. In this case the sensor unit is fully autonomous and does not require any processing power of existing computers within the lithographic projection apparatus. The unit merely receives basic synchronization control signals, such as to start and stop measurements, and signals for communication of results, such as computed Zernike coefficients or other parameters which are computed within the sensor unit.

The above embodiments of the invention describe measuring the properties of the projection system at a particular field point (i.e. a point selected by the source module), however the properties can vary from field point to field point. Therefore a further embodiment is to measure this variation. This is done by using any of the above techniques and either moving the source module and sensor to repeatedly take measurements at different field points, and/or providing multiple sources and sensors such that measurements at multiple field points can be taken in parallel.

The results of the measurements according to any of the above embodiments of the invention can be used to provide feedback. Lens elements may be adjusted, for example by actuators, to reduce or eliminate or compensate for measured aberrations. In another example, in an apparatus in which the numerical aperture is adjustable, e.g. by selecting a setting of a diaphragm, the actual numerical aperture can be measured at a plurality of different settings and then a calibrated lookup table produced to give the actual numerical aperture that you get for a given nominal numerical aperture that is set according to the machine. Furthermore, numerical aperture variation over the field can be compensated by other imaging parameters, for example by dose variation across the field. The lens design can also be modified.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   an interferometric measurement system configured to measure at least one property of the apparatus, wherein the measurement system comprises:
      a radiation steering device configured to steer radiation received from the illumination system through the projection system;
      a source module at the level of the substrate table configured to receive steered radiation from the radiation steering device and to provide an effective angularly dispersed source of radiation; and
      a sensor unit, at the level of the support, configured to receive radiation from the source module through the projection system to perform the measurement.

2. An apparatus according to claim 1, wherein a location at which radiation exits the source module is spatially displaced from a location at which radiation is received by the radiation steering device.

3. An apparatus according to claim 1, wherein the radiation steering device is provided in the substrate table.

4. An apparatus according to claim 1, wherein the radiation steering device comprises a reflector.

5. An apparatus according to claim 1, wherein the measurement system is configured to measure one or more properties selected from the group comprising: wave front aberration, numerical aperture, telecentricity, polarization change and lens transmission profile.

6. An apparatus according to claim 1, wherein the source module and sensor unit each further comprise one or more elements selected from the group comprising: pinhole, lens, grating, waveplate, diffusor, diffractive optical element, and holographic element.

7. An apparatus according to claim 1, wherein the sensor unit further comprises a wireless communication unit configured to communicate with the lithographic apparatus.

8. An apparatus according to claim 1, wherein the sensor unit further comprises a power source comprising at least one battery and/or photovoltaic cell.

9. An apparatus according to claim 1, wherein the interferometer measurement system is a shearing interferometer measurement system.

10. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate;
    an interferometric measurement system configured to measure at least one property of the apparatus, wherein the measurement system comprises:
       a source module at the level of the substrate table to provide an effective angularly disperse source of radiation; and
       a sensor unit, at the level of the support, configured to receive radiation from the source module through the projection system to perform the measurement;
    a radiation steering device configured to steer radiation received from the illumination system to the source module to provide the radiation for the measurement system; and
    a diffusor positioned in a beam path of the radiation before traversing the radiation steering device, but after exiting the projection system.

11. A method for measuring properties of a lithographic apparatus, the lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto a target portion of the substrate,
    wherein the method comprises:
       steering, using a radiation steering device, radiation received from the projection system;
       receiving, at a source module at the level of the substrate table, radiation steered by the radiation steering device;
       angularly dispersing, using an optical element of the source module, the steered radiation; and
       transmitting the angularly disperse radiation from the source module, through the projection system, to a sensor unit at the level of the support,
       wherein the method is an interferometric measurement using the angularly disperse radiation.

12. A method according to claim 11, wherein the sensor unit communicates with the lithographic apparatus wirelessly.

13. A method according to claim 11, wherein a location at which radiation exits the source module is spatially displace from a location at which is received by the radiation steering device.

14. A method according to claim 11, wherein the radiation steering device is provided in the substrate.

15. A method according to claim 11, wherein the method measures one or more properties selected from the group comprising: wave front aberration, numerical aperture, telecentricity, polarization change and lens transmission profile.

16. A method according to claim 11, wherein the source module and sensor unit each further comprises one or more elements selected from the group comprising: pinhole, lens, grating, waveplate, diffusor, diffractive optical element, and holographic element.

17. A method according to claim 11, wherein the interferometer measurement system is a shearing interferometer measurement system.

18. A method for measuring properties of a lithographic apparatus, the lithographic apparatus comprising:
 an illumination system configured to condition a radiation beam;
 a support constructed to support a patterning device, the patterning device being capable of imparting the radiation beam with a pattern in its cross-section to form a patterned radiation beam;
 a substrate table constructed to hold a substrate; and
 a projection system configured to project the patterned radiation beam onto a target portion of the substrate,
wherein the method comprises:
 diffusing radiation before it traverses a radiation steering device, but after it exits the projection system;
 receiving, at a source module at the level of the substrate table, the radiation emerging from the projection system;
 using an optical element of the source module to angularly disperse the radiation; and
 transmitting the angularly disperse radiation from the source module, through the projection system, to a sensor unit at the level of the support,
wherein the method is an interferometric measurement using the angularly disperse radiation, and
wherein the radiation is received from the illumination system by the radiation steering device, and is steered to the source module to provide the radiation for a measurement system.

* * * * *